(12) United States Patent
Kito et al.

(10) Patent No.: US 8,969,945 B2
(45) Date of Patent: Mar. 3, 2015

(54) NONVOLATILE SEMICONDUCTOR MEMORY DEVICE (71) Applicant: Kabushiki Kaisha Toshiba, Tokyo (JP)

(72) Inventors: Masaru Kito, Mie-ken (JP); Tomoo Hishida, Kanagawa-ken (JP); Yoshiaki Fukuzumi, Kanagawa-ken (JP)

(73) Assignee: Kabushiki Kaisha Toshiba, Tokyo (JP), ( * ) Notice: Subject to any disclaimer, the term of this patent is extended or adjusted under 35 U.S.C. 154(b) by 0 days.

(21) Appl. No.: 13/848,248

(22) Filed: Mar. 21, 2013

(65) Prior Publication Data
US 2014/0061766 A1 Mar. 6, 2014

Related U.S. Application Data (60) Provisional application No. 61/696,930, filed on Sep. 5, 2012.

(51) Int. Cl.
H01L 29/792 (2006.01)
H01L 27/115 (2006.01)

(52) U.S. Cl.
CPC .......... H01L 29/792 (2013.01); H01L 29/7926 (2013.01); H01L 27/11565 (2013.01); H01L 27/1157 (2013.01); H01L 27/11575 (2013.01); H01L 27/11582 (2013.01)
USPC ........................................................ 257/324

(58) Field of Classification Search
CPC .................. H01L 27/11524; H01L 27/11529; H01L 27/1157; H01L 29/792
USPC ....... 257/324, 331, E29.3, 326; 438/478, 492
See application file for complete search history.

(56) References Cited

U.S. PATENT DOCUMENTS

| 8,203,884 | B2 | 6/2012 | Kito et al. | |
|---|---|---|---|---|
| 2005/0230748 | A1* | 10/2005 | Saito et al. | 257/331 |
| 2006/0138463 | A1* | 6/2006 | Kim et al. | 257/202 |
| 2007/0252201 | A1* | 11/2007 | Kito et al. | 257/331 |
| 2010/0038616 | A1* | 2/2010 | Nagashima et al. | 257/2 |
| 2010/0207195 | A1 | 8/2010 | Fukuzumi et al. | |
| 2011/0018052 | A1* | 1/2011 | Fujiwara et al. | 257/324 |
| 2011/0019480 | A1 | 1/2011 | Kito et al. | |
| 2011/0284947 | A1 | 11/2011 | Kito et al. | |
| 2011/0287597 | A1 | 11/2011 | Kito et al. | |
| 2013/0126961 | A1 | 5/2013 | Fukuzumi et al. | |

FOREIGN PATENT DOCUMENTS

| JP | 2007-266143 A | 10/2007 |
|---|---|---|
| JP | 2009-146954 A | 7/2009 |
| JP | 2011-23687 | 2/2011 |

* cited by examiner

Primary Examiner — Jarrett Stark
Assistant Examiner — Shahed Ahmed
(74) Attorney, Agent, or Firm — Oblon, McClelland, Maier & Neustadt, L.L.P (57) ABSTRACT According to one embodiment, a nonvolatile semiconductor memory device, includes: a stacked body including a plurality of electrode layers stacked alternately with a plurality of insulating films; a plurality of first channel body layers; a memory film; a plurality of selection gates; a second channel body layer connecting to each of the plurality of first channel body layers; a gate insulating film; and a first interconnect electrically connected to at least one of the plurality of electrode layers. The stacked body has a through-hole communicating from the upper surface of the stacked body to the lower surface of the stacked body outside a cell region. And the first interconnect is drawn out through the through-hole from the upper surface side of the stacked body to the lower surface side of the stacked body.

7 Claims, 11 Drawing Sheets

NONVOLATILE SEMICONDUCTOR MEMORY DEVICE

CROSS-REFERENCE TO RELATED APPLICATIONS

This application is based upon and claims the benefit of priority from the prior U.S. Provisional Patent Application 61/696,930, filed on Sep. 5, 2012; the entire contents of which are incorporated herein by reference.

FIELD

Embodiments described herein relate generally to a nonvolatile semiconductor memory device.

BACKGROUND

Recently, in the field of memory devices, a structure is drawing attention in which memory cells are arranged in three dimensions by making memory holes in a stacked body in which electrode layers that function as control gates are multiply stacked, forming memory films on the side walls of the memory holes, and further forming channel body layers inside the memory holes. This type of memory device has a memory string structure having a U-shaped configuration including a pair of channel body layers extending in the stacking direction of the stacked body and a linking portion that connects the pair of channel body layers to each other.

However, in the case where the number of stacks of the stacked body is increased in this type of memory device, draw-out lines corresponding to the number of stacks become necessary; and the number of pillars that commonalizes the draw-out lines electrically also increases. For example, the block size of the stacked body is said to increase with about the square of the number of stacks. In other words, it is problematic that the block size increases as the number of stacks increases; and downsizing of the memory device cannot be realized.

BRIEF DESCRIPTION OF THE DRAWINGS

FIG. 4A to 4C are schematic views of the nonvolatile semiconductor memory device according to the first embodiment.

FIG. 5A to 5C are schematic views of a nonvolatile semiconductor memory device according to a modification of the first embodiment.

DETAILED DESCRIPTION

In general, according to one embodiment, a nonvolatile semiconductor memory device, includes: a foundation layer; a stacked body provided on the foundation layer, the stacked body including a plurality of electrode layers stacked alternately with a plurality of insulating films; a plurality of first channel body layers piercing the stacked body, and the plurality of first channel body layers extending from an upper surface of the stacked body to a lower surface of the stacked body; a memory film provided between each of the plurality of first channel body layers and each of the plurality of electrode layers; a plurality of selection gates provided on the stacked body; a second channel body layer piercing each of the plurality of selection gates, and the second channel body layer connecting to each of the plurality of first channel body layers; a gate insulating film provided between the second channel body layer and each of the plurality of selection gates; and a first interconnect electrically connected to at least one of the plurality of electrode layers.

The stacked body has a through-hole communicating from the upper surface of the stacked body to the lower surface of the stacked body outside a cell region. The plurality of first channel body layers and the memory film are disposed in the cell region. And the first interconnect is drawn out through the through-hole from the upper surface side of the stacked body to the lower surface side of the stacked body.

Embodiments will now be described with reference to the drawings. Similar members in the description recited below are marked with like reference numerals, and a description of members once described is omitted as appropriate.

First Embodiment

An overview of memory cells of a nonvolatile semiconductor memory device according to a first embodiment will be described.

Figure 1:
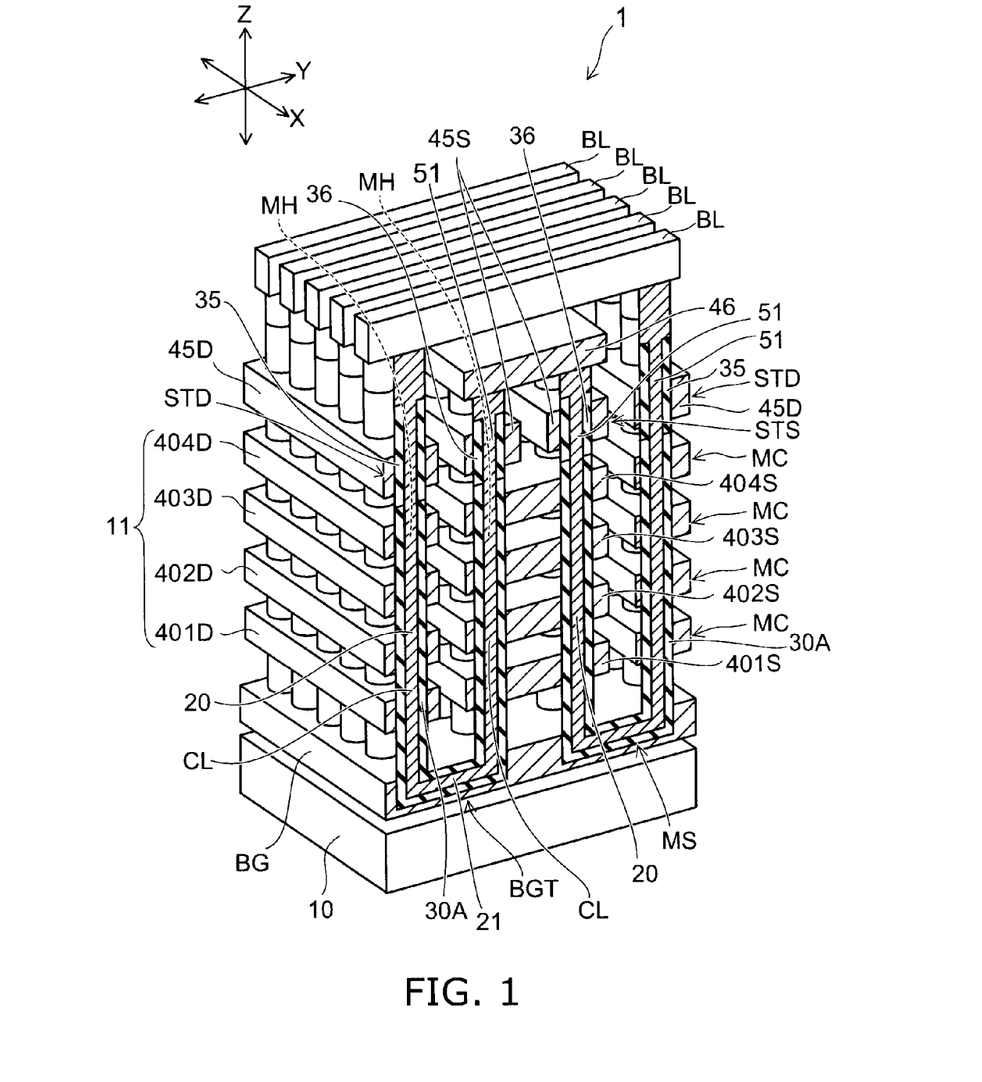
FIG. 1 is a schematic perspective view of a memory cell array of a nonvolatile semiconductor memory device according to a first embodiment.

FIG. 1 is a schematic perspective view of a memory cell array of the nonvolatile semiconductor memory device according to the first embodiment.

Figure 2:
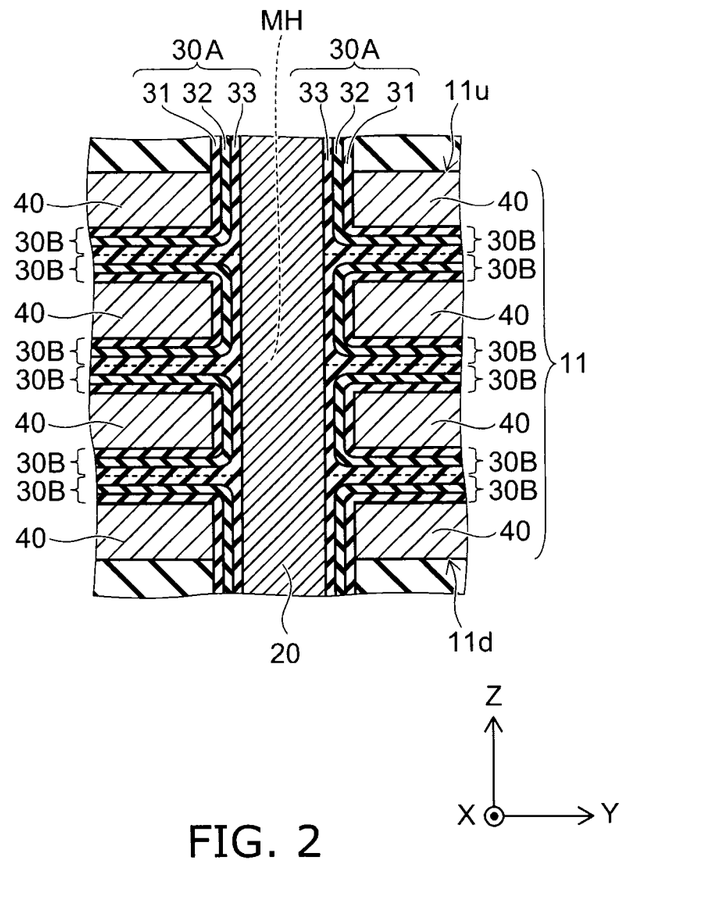
FIG. 2 is an enlarged cross-sectional view of a memory cell portion of FIG. 1.

FIG. 2 is an enlarged cross-sectional view of a memory cell portion of FIG. 1.

Insulating portions other than the insulating films formed on the inner wall of a memory hole MH are not shown for easier viewing of the drawing in FIG. 1.

An XYZ orthogonal coordinate system is introduced for convenience of description in FIG. 1. In this coordinate system, two mutually orthogonal directions parallel to the major surface of a substrate 10 are taken as an X direction and a Y direction; and a direction orthogonal to both the X direction and the Y direction is taken as a Z direction.

In the nonvolatile semiconductor memory device 1, a back gate BG is provided on the substrate 10 with a not-shown insulating layer interposed. The substrate 10 including this insulating layer is called a foundation layer. Active elements such as transistors, passive elements such as resistors, capacitors, etc., are provided inside the substrate 10. The back gate BG is, for example, a silicon (Si) layer to which an impurity element is added.

Multiple insulating layers 30B (referring to FIG. 2), electrode layers 401D, 402D, 403D, and 404D of the drain side, and electrode layers 401S, 402S, 403S, and 404S of the source side are stacked alternately on the back gate BG.

The electrode layer 401D and the electrode layer 401S are provided in the same level and are electrode layers of the first layer from the bottom. The electrode layer 402D and the electrode layer 402S are provided in the same level and are electrode layers of the second layer from the bottom.

The electrode layer 403D and the electrode layer 403S are provided in the same level and are electrode layers of the third layer from the bottom. The electrode layer 404D and the electrode layer 404S are provided in the same level and are electrode layers of the fourth layer from the bottom.

The electrode layer 401D and the electrode layer 401S are divided in the Y direction. The electrode layer 402D and the electrode layer 402S are divided in the Y direction. The electrode layer 403D and the electrode layer 403S are divided in the Y direction. The electrode layer 404D and the electrode layer 404S are divided in the Y direction.

Not-shown insulating layers are provided between the electrode layer 401D and the electrode layer 401S, between the electrode layer 402D and the electrode layer 402S, between the electrode layer 403D and the electrode layer 403S, and between the electrode layer 404D and the electrode layer 404S.

The electrode layers 401D, 402D, 403D, and 404D are provided between the back gate BG and a drain-side selection gate electrode 45D. The electrode layers 401S, 402S, 403S, and 404S are provided between the back gate BG and a source-side selection gate electrode 45S.

The number of layers of the electrode layers 401D, 402D, 403D, 404D, 401S, 402S, 403S, and 404S is arbitrary and is not limited to the four layers shown in FIG. 1. Also, in the description hereinbelow, each of the electrode layers 401D, 402D, 403D, 404D, 401S, 402S, 403S, and 404S may be referred to as simply the electrode layer 40.

The electrode layer 40 is, for example, a silicon layer having conductivity by an impurity being added. The insulating layer 30B may have, for example, the ONO structure described below or may be a single-layer insulating layer (e.g., a silicon oxide layer). The insulating layer 30B is described below as having an ONO structure as an example.

The drain-side selection gate electrode 45D is provided on the electrode layer 404D with a not-shown insulating layer interposed. The drain-side selection gate electrode 45D is, for example, a silicon layer having conductivity by an impurity being added.

The source-side selection gate electrode 45S is provided on the electrode layer 404S with a not-shown insulating layer interposed. The source-side selection gate electrode 45S is, for example, a silicon layer having conductivity by an impurity being added.

The drain-side selection gate electrode 45D and the source-side selection gate electrode 45S are divided in the Y direction. The drain-side selection gate electrode 45D and the source-side selection gate electrode 45S may be referred to as simply the selection gate electrode 45 without discriminating.

A source line SL is provided on the source-side selection gate electrode 45S with a not-shown insulating layer interposed. The source line SL is a metal layer or a silicon layer having conductivity by an impurity being added.

Multiple bit lines BL are provided on the drain-side selection gate electrode 45D and the source line SL with a not-shown insulating layer interposed. Each of the bit lines BL extends in the Y direction.

The memory hole MH having a U-shaped configuration is multiply formed in the back gate BG and in a stacked body 11 on the back gate BG. For example, a hole extending in the Z direction is made to pierce the electrode layers 401D to 404D and the drain-side selection gate electrode 45D. A hole extending in the Z direction is made to pierce the electrode layers 401S to 404S and the source-side selection gate electrode 45S. The pair of holes extending in the Z direction communicate with each other via a recess (a hollow portion) formed in the back gate BG to form the memory hole MH having the U-shaped configuration.

A channel body layer 20 (a first channel body layer) is provided in a U-shaped configuration in the interior of the memory hole MH. The channel body layer 20 is, for example, a silicon layer. A memory film 30A is provided between the channel body layer 20 and the inner wall of the memory hole MH.

A gate insulating film 35 is provided between the drain-side selection gate electrode 45D and a channel body layer 51 (a second channel body layer) connected to the channel body layer 20. The channel body layer 51 is, for example, a silicon layer. A gate insulating film 36 is provided between the channel body layer 51 and the source-side selection gate electrode 45S.

The structure is not limited to the entire interior of the memory hole MH being filled with the channel body layer 20; and the structure may be such that the channel body layer 20 is formed such that a hollow portion remains on the central axis side of the memory hole MH and an insulator is filled into the hollow portion inside the channel body layer 20.

The memory film 30A has, for example, an ONO (Oxide-Nitride-Oxide) structure in which a silicon nitride film is interposed between a pair of silicon oxide films. As shown in FIG. 2, an insulating film 31, a charge storage film 32, and an insulating film 33 are provided in order from the electrode layer 40 side between the channel body layer 20 and each of the electrode layers 40. The insulating film 31 contacts the electrode layer 40; the insulating film 33 contacts the channel body layer 20; and the charge storage film 32 is provided between the insulating film 31 and the insulating film 33. Two layers of the insulating layers 30B are provided between the electrode layers 40. The insulating film 31 is, for example, a silicon oxide film. The charge storage film 32 is, for example, a silicon nitride film. The insulating film 33 is, for example, a silicon oxide film.

The channel body layer 20 functions as a channel of transistors included in the memory cells; the electrode layers 40 function as control gates; and the charge storage film 32 functions as a data storage layer that stores the charge injected from the channel body layer 20. In other words, memory cells MC having a structure in which the control gate is provided around the channel are formed at the intersections between the channel body layer 20 and each of the electrode layers 40.

The nonvolatile semiconductor memory device 1 of the first embodiment is a nonvolatile semiconductor memory device that can freely and electrically erase/program data and retain the memory content even when the power supply is OFF.

The drain-side selection gate electrode 45D, the channel body layer 20, and the gate insulating film 35 between the drain-side selection gate electrode 45D and the channel body layer 20 are included in a drain-side selection transistor STD. The channel body layer 20 above the drain-side selection transistor STD is connected to the bit line BL.

The source-side selection gate electrode 45S, the channel body layer 51, and the gate insulating film 36 between the source-side selection gate electrode 45S and the channel body layer 51 are included in a source-side selection transistor STS. The channel body layer 51 above the source-side selection transistor STS is connected to the source line SL.

The back gate BG, the channel body layer 20 provided inside the back gate BG, and the memory film 30A provided inside the back gate BG are included in a back gate transistor BGT.

The memory cells MC having each of the electrode layers 404D to 401D as control gates are multiply provided between the drain-side selection transistor STD and the back gate transistor BGT. Similarly, the memory cells MC having each of the electrode layers 401S to 404S as control gates are multiply provided between the back gate transistor BGT and the source-side selection transistor STS.

The multiple memory cells MC, the drain-side selection transistor STD, the back gate transistor BGT, and the source-side selection transistor STS are connected in series via the channel body layer and are included in one memory string MS having a U-shaped configuration.

One memory string MS includes a pair of columnar portions CL extending in the stacking direction of the stacked body 11 including the multiple electrode layers 40, and a linking portion 21 that is filled into the back gate BG to link the pair of columnar portions CL. By the memory string MS being multiply arranged in the X direction and the Y direction, multiple memory cells are provided three-dimensionally in the X direction, the Y direction, and the Z direction.

The multiple memory strings MS are provided in a memory cell array region of the substrate 10. A peripheral circuit that controls the memory cell array is provided, for example, at the periphery of the memory cell array region of the substrate 10.

Figure 3A:
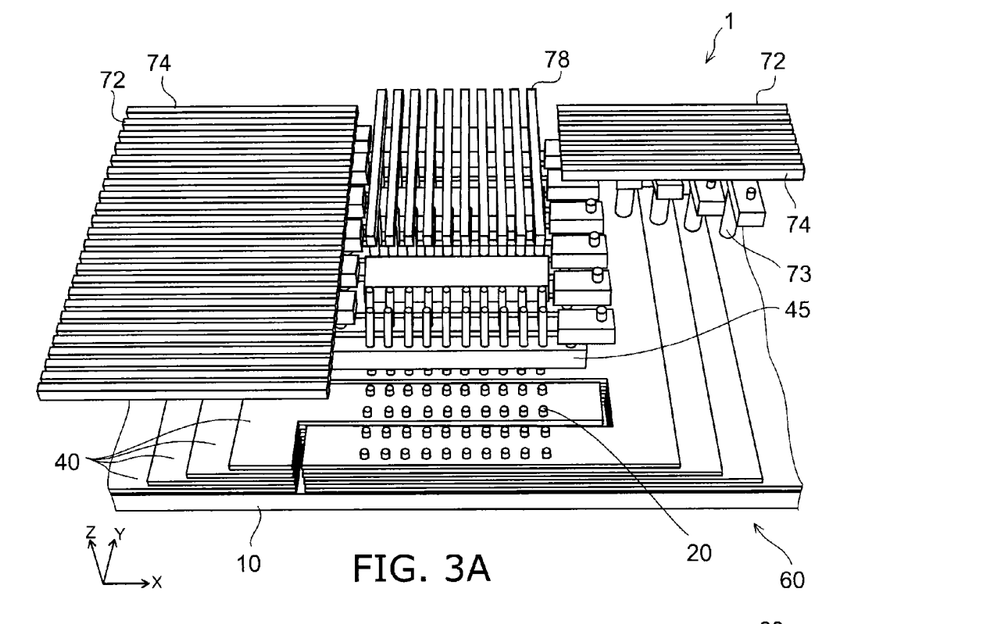
FIG. 3A and FIG. 3B are schematic perspective views of the nonvolatile semiconductor memory device according to the first embodiment.
Figure 3B:
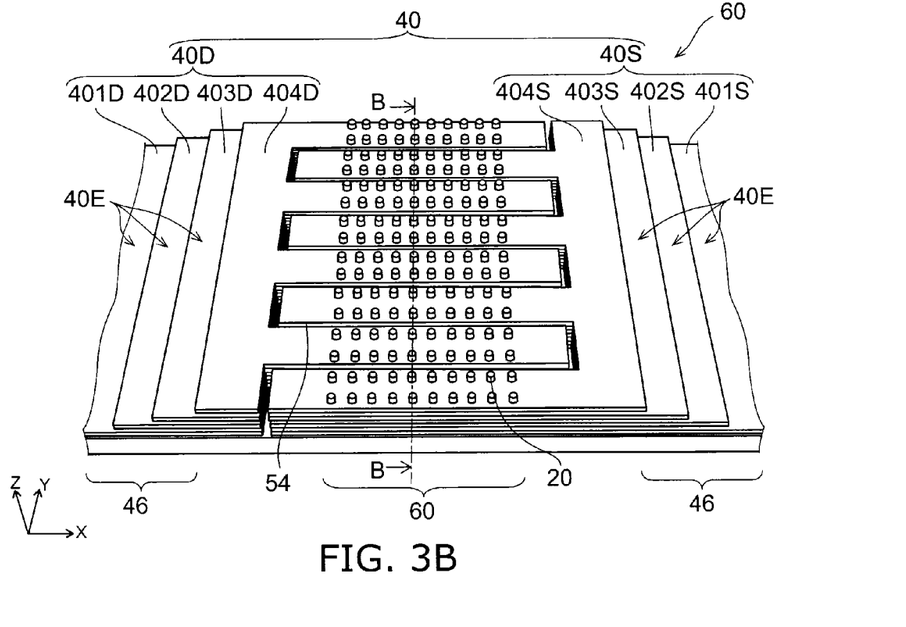

FIG. 3A and FIG. 3B are schematic perspective views of the nonvolatile semiconductor memory device according to the first embodiment.

FIG. 3A shows the entire image of the nonvolatile semiconductor memory device 1 including the memory cells. FIG. 3B shows the vicinity of a memory cell formation region 60 (hereinbelow, the cell region 60) of the nonvolatile semiconductor memory device 1. The B-B cross section of FIG. 3B corresponds to the front surface of FIG. 1.

In the nonvolatile semiconductor memory device 1 as shown in FIG. 3A, the electrode layers 40 are stacked in a stairstep configuration on the substrate 10. Word interconnects 72 (first interconnects) are provided above the multiple electrode layers 40; and the word interconnects 72 are electrically connected to the electrode layers 40 via contact electrodes 73. The materials of the word interconnects 72 and the contact electrodes 73 are, for example, metals.

The multiple channel body layers 20 are electrically connected respectively to bit lines 78. The selection gate electrodes 45 are provided between the bit lines 78 and the electrode layers 40. The selection gate electrodes 45 are connected to gate interconnects 74 (second interconnects). The materials of the bit lines 78 and the gate interconnects 74 are, for example, metals.

The word interconnects 72 (or the gate interconnects 74) extend in the X direction. The bit lines 78 extend in the Y direction.

In the cell region 60 of the nonvolatile semiconductor memory device 1 as shown in FIG. 3B, the electrode layers 40 are stacked in the Z direction. Each of the electrode layers 40 is divided into an electrode layer 40D of the drain side and an electrode layer 40S of the source side by a slit 54 provided in the X-Y plane. The electrode layer 40D of the drain side includes the electrode layers 401D, 402D, 403D, and 404D. The electrode layer 40S of the source side includes the electrode layers 401S, 402S, 403S, and 404S.

The slit 54 is a trench extending in the X direction and the Y direction. When the slit 54 is viewed from the Z direction, the pattern of the slit 54 has a rectangular wave configuration. For the electrode layer 40 of each layer as viewed from the Z direction, the electrode layer 40D and the electrode layer 40S mesh with each other with the slit 54 interposed. Also, as viewed from the Z direction, two columns of the channel body layers 20 are arranged in the X direction in the electrode layer 40D and in the electrode layer 40S. Further, in the nonvolatile semiconductor memory device 1, the electrode layer 40 of the drain side and the electrode layer 40 of the source side are drawn out respectively to opposite sides (the −X direction and the +X direction).

Although the electrode layers 40 having a four-layer structure are shown in FIG. 3, the embodiment is not limited to this number of layers. For example, the number of stacks of the electrode layers 40 is arbitrary. The number of the channel body layers 20 provided in the X direction also is arbitrary.

Thus, the nonvolatile semiconductor memory device 1 includes the foundation layer, and the stacked body 11 provided on the foundation layer to include the multiple electrode layers 40 stacked alternately with the multiple insulating layers 30B. The nonvolatile semiconductor memory device 1 further includes the multiple channel body layers 20 piercing the stacked body 11 to extend from an upper surface 11u of the stacked body 11 to a lower surface 11d of the stacked body 11, and the memory film 30A provided between each of the multiple channel body layers 20 and each of the multiple electrode layers 40.

Also, the nonvolatile semiconductor memory device 1 includes the multiple selection gate electrodes 45 provided on the stacked body 11, the channel body layer 51 piercing each of the multiple selection gate electrodes 45 to connect to each of the multiple channel body layers 20, and the gate insulating film 35 (or the gate insulating film 36) provided between the channel body layer 51 and each of the multiple selection gate electrodes 45. The nonvolatile semiconductor memory device 1 also includes the word interconnect 72 electrically connected to at least one of the multiple electrode layers 40. The nonvolatile semiconductor memory device 1 further includes the gate interconnect 74 electrically connected to at least one of the multiple selection gate electrodes 45.

Further, among the multiple electrode layers 40 as shown in FIG. 3B, at least one of the electrode layers 401D, 402D, 403D, 401S, 402S, and 403S other than the uppermost electrode layers 404D and 404S has an exposed portion 40E. None of the multiple electrode layers 40 and none of the multiple insulating layers 30B are provided on the exposed portion 40E. In other words, the stacked body 11 shown in FIG. 2 has multiple exposed portions 40E. Each of the multiple exposed portions 40E has a difference in levels. The stacked body 11 has a stairstep region 46 where stairsteps are made of the multiple exposed portions 40E. The word interconnect 72 is electrically connected to at least one of the multiple exposed portions 40E in the stairstep region 46.

Figure 4A:
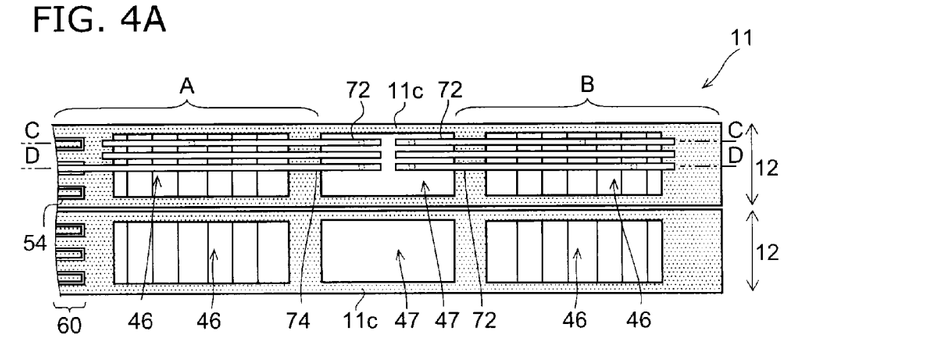
FIG. 4A is a schematic plan view.
Figure 4B:
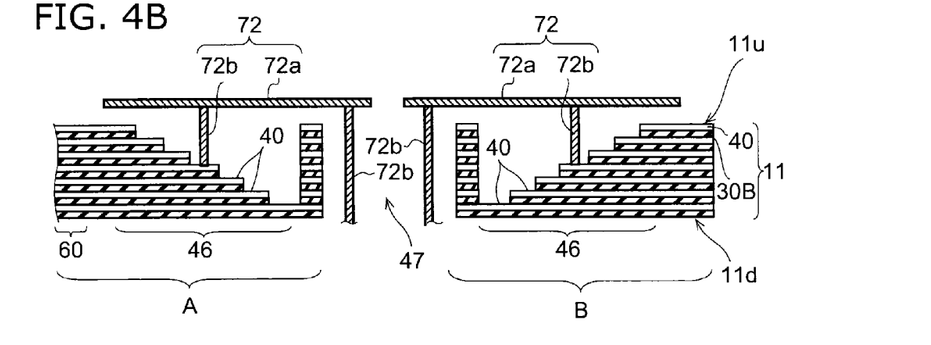
FIG. 4B is a schematic cross-sectional view along line C-C of FIG. 4A.
Figure 4C:
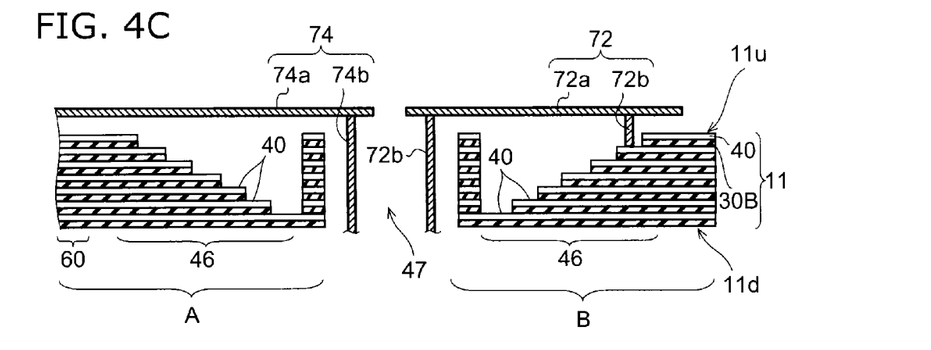
FIG. 4C is a schematic cross-sectional view along line D-D of FIG. 4A.

Further, a through-hole is provided in the stacked body 11 of the nonvolatile semiconductor memory device 1 outside the cell region 60. The structure of the nonvolatile semiconductor memory device 1 having the through-hole is described using FIG. 4.

FIG. 4 is a schematic view of the nonvolatile semiconductor memory device according to the first embodiment; FIG. 4A is a schematic plan view; FIG. 4B is a schematic cross-sectional view along line C-C of FIG. 4A; and FIG. 4C is a schematic cross-sectional view along line D-D of FIG. 4A.

FIG. 4 shows the stacked body 11 including the stairstep region 46 from partway through the cell region 60. The number of the word interconnects 72 and the number of the gate interconnects 74 shown in the drawings are examples; and these are not limited to the numbers shown. Also, the stacked body 11 inside a block width 12 is one block. The multiple stacked bodies 11 are arranged to be separated by a prescribed spacing (e.g., about the width of the slit 54).

Other than the stairstep region 46, a through-hole 47 is provided in the stacked body 11 of the nonvolatile semiconductor memory device 1. The through-hole 47 is provided outside the cell region 60 where the multiple channel body layers 20 and the memory film 30A are disposed. The through-hole 47 communicates from the upper surface 11u of the stacked body 11 to the lower surface 11d of the stacked body 11.

Also, the stacked body 11 on two sides of the through-hole 47 is linked by a linking portion 11c. That is, the stacked body 11 is not divided into the left and the right with the through-hole 47 as a reference. In other words, the linking portion 11c is a portion of the stacked body 11. In the stacked body 11, the electrode layer 40 of the Nth layer from the bottom of the A region and the electrode layer 40 of the Nth layer from the bottom of the B region have same potential via the linking portion 11c of the stacked body 11 (N: any natural number). Then, the word interconnect 72 is electrically connected to one of the multiple electrode layers 40 exposed in the stairstep region 46. The word interconnect 72 includes a metal interconnect layer portion 72a and a metal contact portion 72b connected to the metal interconnect layer portion 72a. The metal interconnect layer portion 72a extends substantially parallel to the upper surface of the stacked body 11; and the metal contact portion 72b extends substantially perpendicular to the upper surface of the stacked body 11.

In the first embodiment, not all of the multiple word interconnects 72 inside one block are arranged only in the direction of the block width 12. That is, in the first embodiment, the multiple word interconnects 72 are arranged not only in the direction of the block width 12 but also in a direction perpendicular to the direction of the block width 12. For example, the word interconnects 72 connected to each of the levels of the multiple electrode layers 40 are grouped into the A region and the B region as shown in FIG. 4A and FIG. 4B. Then, the word interconnects 72 disposed in each of the regions are arranged in the direction of the block width 12.

Thus, the reason that the multiple word interconnects 72 can be disposed by being grouped is because the electrode layer 40 of the Nth level of the A region and the electrode layer 40 of the Nth level of the B region are linked via the linking portion 11c of the stacked body 11. For example, the word lines 72 connected to the electrode layers 40 of the odd levels can be disposed in the A region; and the word lines 72 connected to the electrode layers 40 of the even levels can be disposed in the B region.

Thereby, the word interconnects 72 respectively connected to the multiple electrode layers 40 inside one block are contained inside the block width 12.

Further, in the first embodiment, at least one of the multiple word interconnects 72 (the metal contact portions 72b) disposed in the A region or the B region is drawn out through the through-hole 47 from the upper surface 11u side of the stacked body 11 to the lower surface 11d side of the stacked body 11.

The interconnect drawn out from the upper surface 11u side of the stacked body 11 to the lower surface 11d side of the stacked body 11 is not limited to the word interconnect 72. For example, the gate interconnect 74 drawn out from the selection gate electrode may be drawn out through the through-hole 47 from the upper surface 11u side of the stacked body 11 to the lower surface 11d side of the stacked body 11 (FIG. 4C). Here, the gate interconnect 74 includes a metal interconnect layer portion 74a and a metal contact portion 74b connected to the metal interconnect layer portion 74a. The metal interconnect layer portion 74a extends substantially parallel to the upper surface of the stacked body 11; and the metal contact portion 74b extends substantially perpendicular to the upper surface of the stacked body 11. Then, as for the word interconnect 72, the gate interconnect 74 (the metal contact portion 74b) may be drawn out through the through-hole 47 from the upper surface 11u side of the stacked body 11 to the lower surface 11d side of the stacked body 11.

Figure 5A:
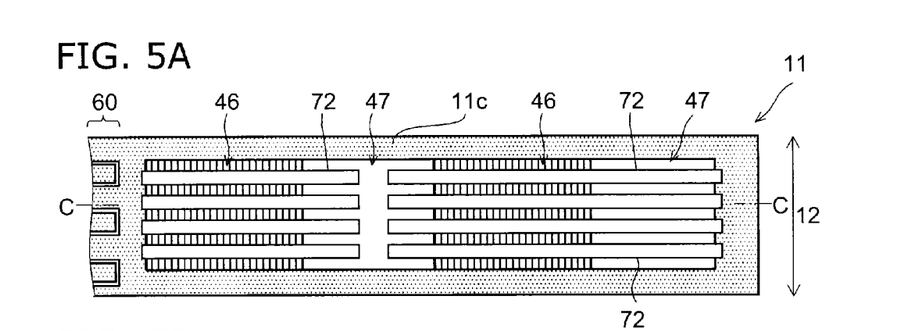
FIG. 5A is a schematic plan view.
Figure 5B:
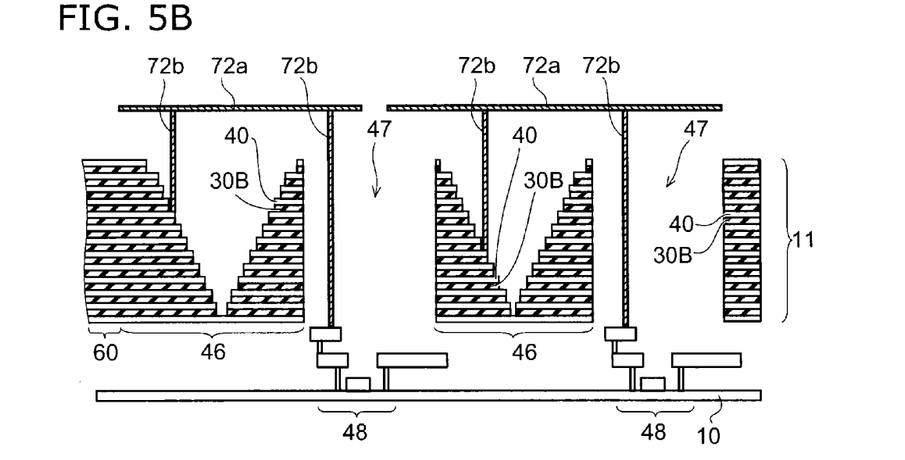
FIG. 5B is a schematic cross-sectional view along line C-C of FIG. 5A.

Also, the through-hole 47 is not limited to being one through-hole. A structure of the stacked body 11 having multiple through-holes 47 will be described next.

Figure 5C:
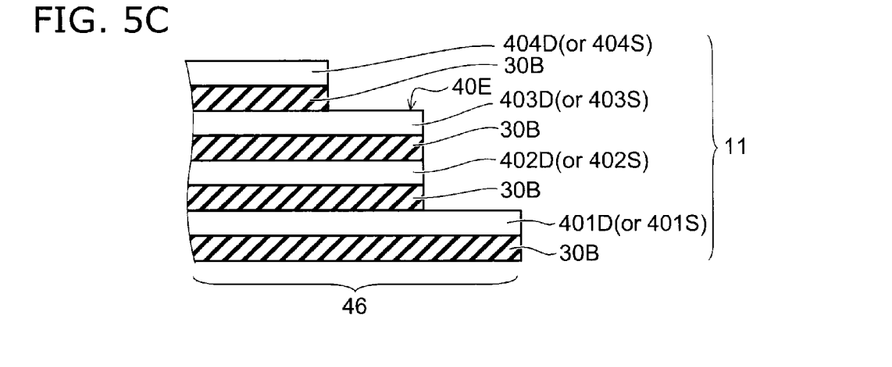
FIG. 5C is another example of the stairstep region.

FIG. 5 is a schematic view of a nonvolatile semiconductor memory device according to a modification of the first embodiment; FIG. 5A is a schematic plan view; FIG. 5B is a schematic cross-sectional view along line C-C of FIG. 5A; and FIG. 5C is another example of the stairstep region.

The through-hole 47 provided in the stacked body 11 is not limited to being one through-hole; and two or more may be provided. For example, two through-holes 47 are shown in FIG. 5A and FIG. 5B. Then, at least one of the multiple word interconnects 72 connected to the electrode layers 40 is drawn out through the through-hole 47 from the upper surface 11u side of the stacked body 11 to the lower surface 11d side of the stacked body 11. The word interconnect 72 that is drawn out is connected to an element (e.g., a transistor 48) provided in the substrate 10 on the lower side of the stacked body 11.

Thus, according to the nonvolatile semiconductor memory device 1, the word interconnect 72 can be drawn out through the through-hole 47 from the upper surface 11u side to the lower surface 11d side of the stacked body 11. Thereby, elements such as the transistor 48, etc., can be disposed on the lower side of the stacked body 11. As a result, the degrees of freedom of the disposition of the elements increases in the nonvolatile semiconductor memory device 1.

Also, as described above, the interconnect drawn out from the upper surface 11u side of the stacked body 11 to the lower surface 11d side of the stacked body 11 is not limited to the word interconnect 72 and may be the gate interconnect 74. Further, a not-shown insulating layer is provided inside the through-holes 47 and on the electrode layers 40 of the stairstep region 46; and the draw-out interconnects thereof are insulated.

Also, the structure of the stairstep region 46 is not limited that all of the electrode layers 40 other than the electrode layer 40 of the uppermost layer have the exposed portion 40E. For example, in the example of four layers of the electrode layers 40 as shown in FIG. 5C, the upper surface of the electrode layer 402D (or the electrode layer 402D) is covered with the electrode layer 403D (or the electrode layer 403D); and the electrode layer 402D (or the electrode layer 402D) does not have the exposed portion 40E. In other words, the number of the exposed portions 40E is adjusted according to the number of the word interconnects 72 that are disposed.

Figure 6:
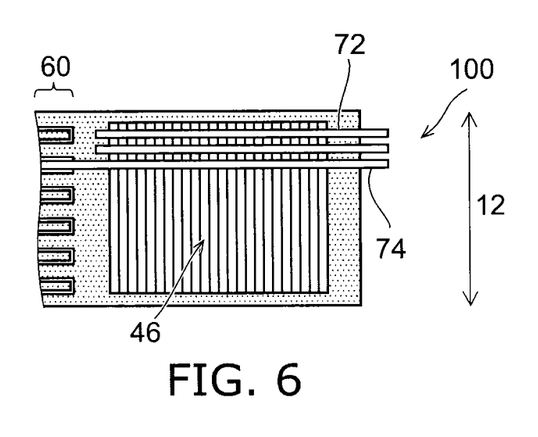
FIG. 6 is a schematic plan view of a nonvolatile semiconductor memory device according to a reference example.

Effects of the nonvolatile semiconductor memory device 1 according to the first embodiment will be described. First, before describing effects of the nonvolatile semiconductor memory device 1, a nonvolatile semiconductor memory device according to a reference example will be described.

FIG. 6 is a schematic plan view of a nonvolatile semiconductor memory device according to a reference example.

The through-hole 47 described above is not provided in the nonvolatile semiconductor memory device 100 according to the reference example. Accordingly, in the reference example, the multiple word interconnects 72 or the multiple gate interconnects 74 must be arranged in the direction of the block width 12. In such a case, it is necessary for the block width 12 of the nonvolatile semiconductor memory device 100 to be, for example, not less than (m+n)×S, where the number of stacks of the electrode layers 40 is m, the number of the selection gate electrodes is n, and the pitch of the interconnects is S. This is because the multiple word interconnects 72 undesirably short to each other or the multiple gate interconnects 74 undesirably short to each other in the case where the block width 12 is less than (m+n)×S.

In the case where the number of stacks of the stacked body 11 increases in the nonvolatile semiconductor memory device 100, a number of the word interconnects 72 corresponding to the number of stacks becomes necessary; and the block width 12 undesirably increases by this amount. In other words, this causes an enlargement of the nonvolatile semiconductor memory device in the block width direction. Further, in the case where the block width 12 increases, the number of the pillars that commonalize the word interconnects 72 electrically also increases. Thereby, the manufacturing processes for manufacturing the nonvolatile semiconductor memory device become complex.

To suppress the block width increase that accompanies such an increase of the number of stacks, there exist measures such as making the line width of the word interconnects 72 or the gate interconnects 74 finer, and shortening the arrangement pitch of the word interconnects 72 or the gate interconnects 74. However, as the downscaling of the nonvolatile semiconductor memory device 100 progresses, difficulties in the manufacturing processes accompany such line width reductions and arrangement pitch reductions.

Conversely, in the nonvolatile semiconductor memory device 1 according to the first embodiment, it is possible to draw out at least one of the multiple word interconnects 72 or at least one of the multiple gate interconnects 74 through the through-hole 47 provided in the stacked body 11 from the upper surface 11u side of the stacked body 11 to the lower surface 11d side of the stacked body 11.

Figure 7A:
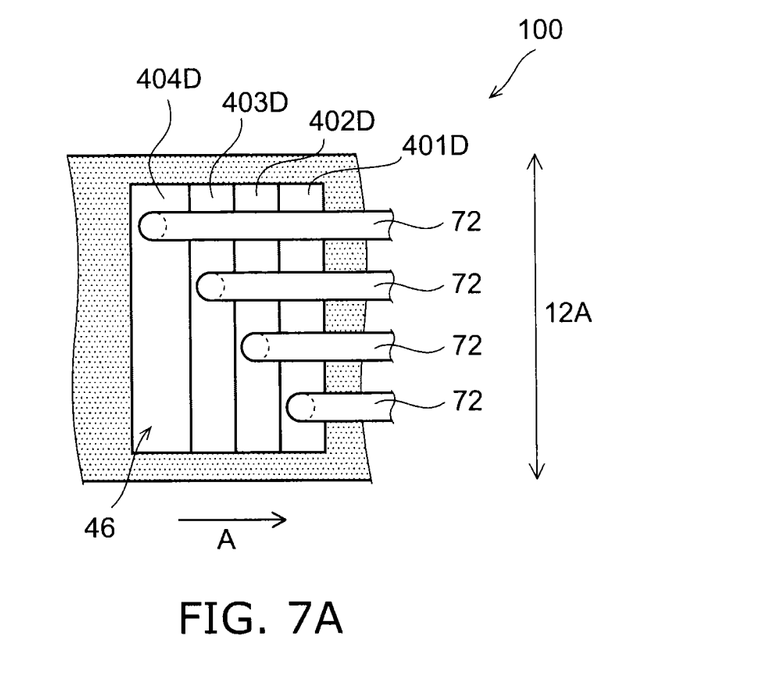
FIG. 7A and FIG. 7B are schematic top views describing the effects of the nonvolatile semiconductor memory device.
Figure 7B:
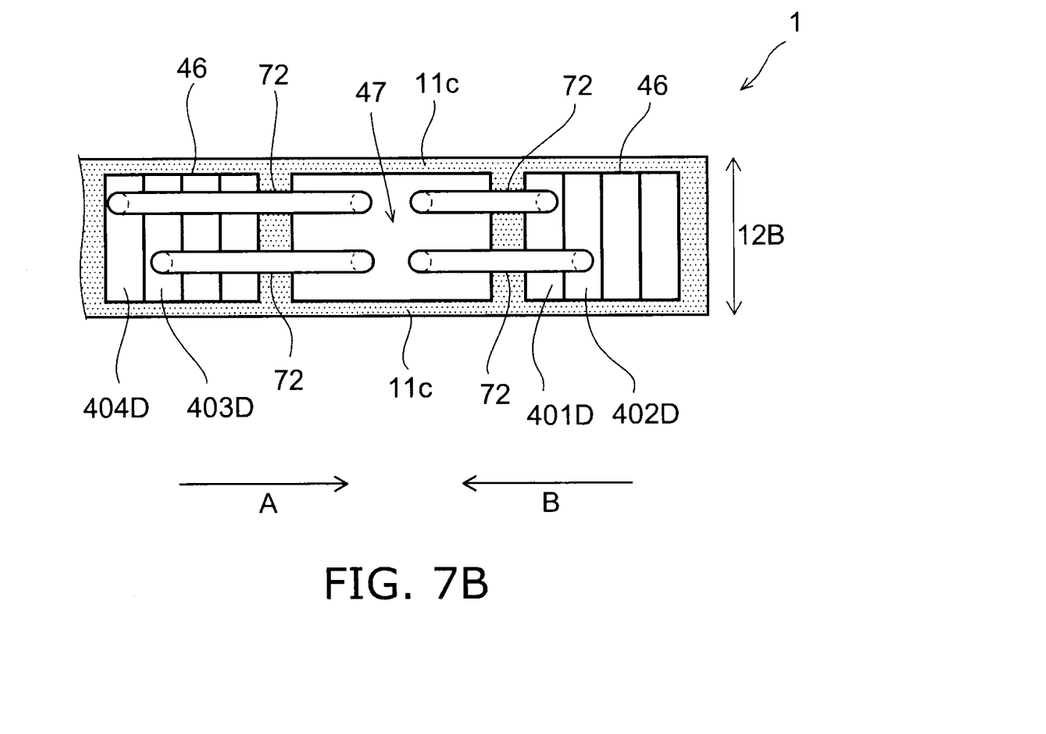

FIG. 7A and FIG. 7B are schematic top views describing the effects of the nonvolatile semiconductor memory device.

For example, the effects of the nonvolatile semiconductor memory device 1 are described using the word interconnects 72 and the electrode layers 40 of four layers of the drain side as an example.

In the stacked body 11 of the nonvolatile semiconductor memory device 100 according to the reference example, it is necessary to draw the word interconnects 72 connected to the electrode layers 401D, 402D, 403D, and 404D of each layer in the direction of arrow A. Accordingly, a block width 12A, that is wide enough to draw all of the word interconnects 72 in the direction of arrow A without contacting each other, becomes necessary. Moreover, in the reference example, all of the word interconnects 72 are arranged only in the direction of the block width 12A. However, in such a case, the discrepancies described above undesirably occur.

Conversely, in the stacked body 11 of the nonvolatile semiconductor memory device 1, the word interconnect 72 connected to the electrode layer 401D and the word interconnect 72 connected to the electrode layer 402D can be drawn in the direction of arrow B. On the other hand, the word interconnect 72 connected to the electrode layer 403D and the word interconnect 72 connected to the electrode layer 404D can be drawn in the direction of arrow A on the side opposite to arrow B.

In other words, even in the case where the number of stacks is the same for the nonvolatile semiconductor memory device 1 and the nonvolatile semiconductor memory device 100, a block width 12B necessary to draw the interconnects is reduced to be about half of the block width 12A by providing the through-hole 47 in the nonvolatile semiconductor memory device 1. Accordingly, in the nonvolatile semiconductor memory device 1, the enlargement of the nonvolatile semiconductor memory device in the block width direction is suppressed. Moreover, in the nonvolatile semiconductor memory device 1, it is unnecessary to reduce the line width of the word interconnect or reduce the pitch of the arrangement even in the case where the downscaling progresses. Accordingly, the difficulties of the manufacturing processes also do not occur.

The case where there is no through-hole 47 in the nonvolatile semiconductor memory device 1 is assumed. In such a case, even if the multiple word interconnects 72 are grouped into the A region and the B region, it is necessary to extend the word interconnects 72 of each of the regions to the end of the stacked body 11 because there is no through-hole 47. Accordingly, the word lines 72 are ultimately undesirably dense at the end of the stacked body 11. Therefore, the block width 12 must be widened. In the nonvolatile semiconductor memory device 1, the enlargement of the nonvolatile semiconductor memory device in the block width direction is avoided by separating the multiple word interconnects 72 into the multiple regions and providing the through-hole 47.

Also, in the nonvolatile semiconductor memory device 1, the gate interconnects 74 drawn out from the selection gate electrodes can pass through the through-hole 47. Conventionally, the gate interconnects 74 were drawn a long distance in a direction parallel to the upper surface of the electrode layers 40 without passing through the through-hole 47. According to the nonvolatile semiconductor memory device 1, the region of the long drawing becomes empty. It becomes possible to draw other interconnects in this empty region. In other words, according to the nonvolatile semiconductor memory device 1, the degrees of freedom of the drawing of the interconnects increase.

Thus, in the nonvolatile semiconductor memory device 1, the increase of the block width 12 (or the block size) is suppressed even in the case where the number of stacks increases; and the draw-out interconnects such as the word interconnects 72, the gate interconnects 74, etc., can be drawn inside the nonvolatile semiconductor memory device 1 without contact.

Second Embodiment

Figure 8:
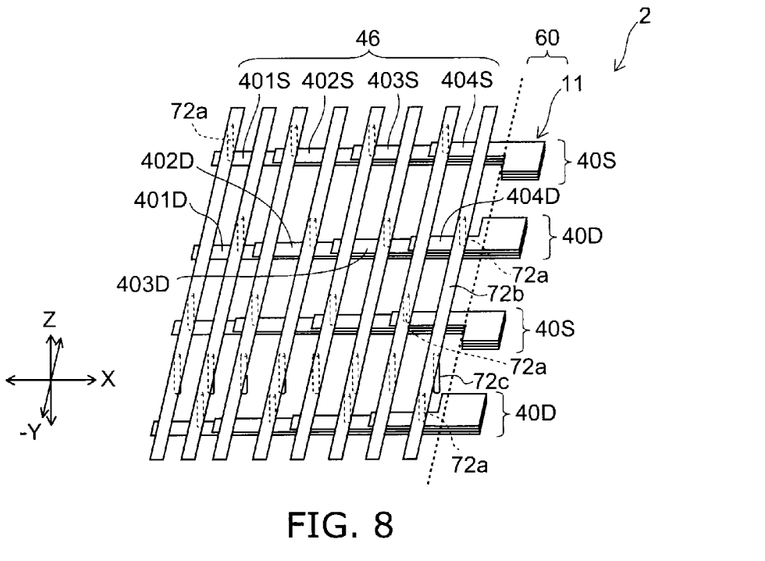
FIG. 8 is a schematic perspective view of a nonvolatile semiconductor memory device according to a second embodiment.

FIG. 8 is a schematic perspective view of a nonvolatile semiconductor memory device according to a second embodiment.

Figure 9:
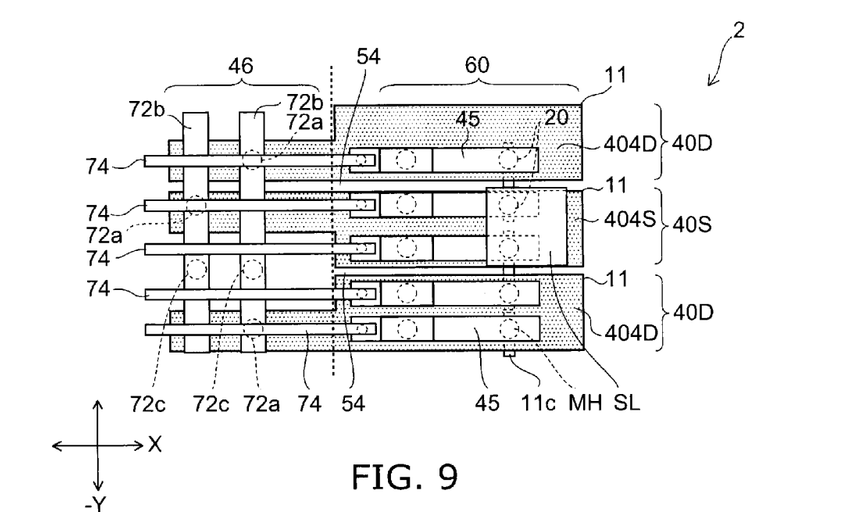
FIG. 9 is a schematic plan view of the nonvolatile semiconductor memory device according to the second embodiment.

FIG. 9 is a schematic plan view of the nonvolatile semiconductor memory device according to the second embodiment.

The multiple gate interconnects 74 shown in FIG. 9 are not shown in FIG. 8.

The basic structure of the cell region 60 of the nonvolatile semiconductor memory device 2 according to the second embodiment is the same as the basic structure of the cell region 60 of the nonvolatile semiconductor memory device 1. However, in the nonvolatile semiconductor memory device 2, the electrode layers 40 of the drain side and the electrode layers 40 of the source side are drawn out to the same side (e.g., the side of the –X direction in FIGS. 8 and 9).

In the nonvolatile semiconductor memory device 2, the stacked body 11 is divided by the slit 54. The word interconnects 72 are drawn out through the slit 54 from the upper surface 11u side of the stacked body 11 to the lower surface 11d side of the stacked body 11. The gate interconnects 74 also may be drawn out through the slit 54 from the upper surface 11u side of the stacked body 11 to the lower surface 11d side of the stacked body 11.

For example, the stacked body 11 is divided into a first stacked body 11 and a second stacked body 11 by the slit 54. Here, for example, the stacked body 11 in which the electrode layers 40S of the source side are stacked corresponds to the first stacked body 11. For example, the stacked body 11 in which the electrode layers 40D of the drain side are stacked corresponds to the second stacked body 11.

The word interconnect 72 includes two vias 72a and 72c and the draw-out interconnect 72b. For example, the draw-out interconnect 72b is connected to the via 72a that is connected to the electrode layer 404D; and the via 72c connected to the draw-out interconnect 72b is drawn out between the stairstep region 46 of the first stacked body and the stairstep region 46 of the second stacked body from the upper surface 11u side of the stacked body 11 to the lower surface 11d side of the stacked body 11. Also, the draw-out interconnect 72b is connected to the via 72a that is connected to the electrode layer 404S; and the via 72c connected to the draw-out interconnect 72b is drawn out between the stairstep region 46 of the first stacked body and the stairstep region 46 of the second stacked body from the upper surface 11u side of the stacked body 11 to the lower surface 11d side of the stacked body 11. The vias 72a and 72c and the draw-out interconnect 72b are drawn by a similar method for the electrode layers of the layers other than the electrode layers 404D and 404S.

In other words, the word interconnect 72 electrically connected to the electrode layer 40 of the Nth layer is drawn out between the stairstep region 46 of the first stacked body (the stacked body 11 in which the electrode layers 40S of the source side are stacked) and the stairstep region 46 of the second stacked body (the stacked body 11 in which the electrode layers 40D of the drain side are stacked) from the upper surface 11u side of the stacked body 11 to the lower surface 11d side of the stacked body 11.

Further, the distance between the cell region 60 and the stairstep region 46 of the first stacked body (the stacked body 11 in which the electrode layers 40S of the source side are stacked) is equal to the distance between the cell region 60 and the stairstep region 46 of the second stacked body (the stacked body 11 in which the electrode layers 40D of the drain side are stacked).

Here, the widths of the electrode layers 40 in the second direction (the Y direction) parallel to the upper surface 11u of the stacked body 11 and orthogonal to the first direction (the X direction) in which the slit 54 extends has a relationship such as that recited below.

For example, the width of the stairstep region 46 of the first stacked body (the stacked body 11 in which the electrode layers 40S of the source side are stacked) in the Y direction is narrower than the width of the cell region 60 of the first stacked body in the Y direction. Similarly, the width of the stairstep region 46 of the second stacked body (the stacked body 11 in which the electrode layers 40D of the drain side are stacked) in the Y direction is narrower than the width of the cell region 60 of the second stacked body in the Y direction. The first stacked body (the stacked body 11 in which the electrode layers 40S of the source side are stacked) planar configuration and the planar configuration of the second stacked body (the stacked body 11 in which the electrode layers 40D of the drain side are stacked) are the same and have a relationship of line symmetry with the center line of the slit 54 as an axis. Thereby, the width of the slit 54 of the stairstep region 46 is wider than the width of the slit 54 of the cell region 60.

Thus, in the nonvolatile semiconductor memory device 2, the word interconnects 72 or the gate interconnects 74 are drawn out between the slit 54 of the stairstep region 46 from the upper surface 11u side of the stacked body 11 to the lower surface 11d side of the stacked body 11.

In such a structure as well, effects similar to those of the nonvolatile semiconductor memory device 1 are obtained. In the nonvolatile semiconductor memory device 2, it is unnecessary to draw out interconnects extending in the –X direction from the electrode layers 40 of each layer because the word interconnects 72 extend in the Y direction. Thereby, the drawing region of the gate interconnects 74 can be increased. In other words, the arrangement pitch of the multiple gate interconnects 74 can be increased. It is sufficient for the width of the stacked body 11 in the stairstep region 46 to be wide enough that the via 72a can be disposed.

First Modification of Second Embodiment

Figure 10:
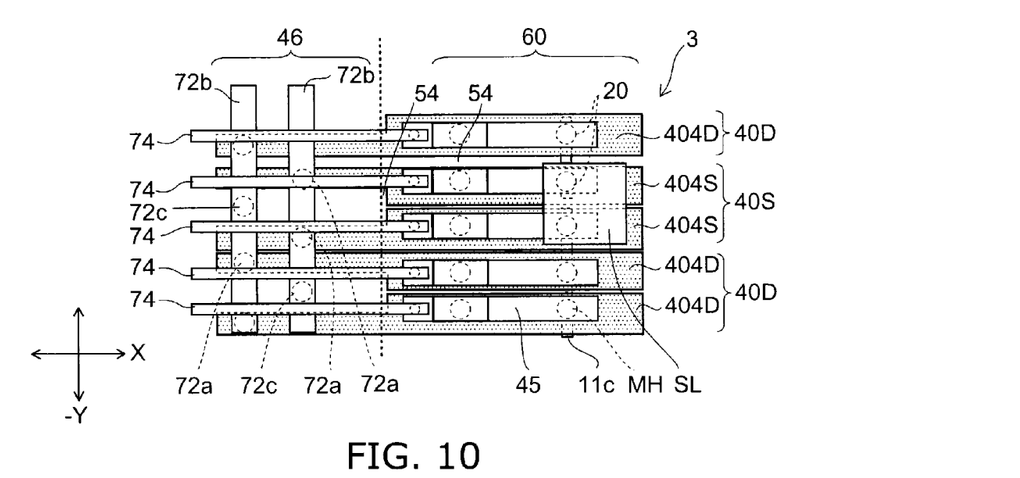
FIG. 10 is a schematic plan view of a nonvolatile semiconductor memory device according to a first modification of the second embodiment.

FIG. 10 is a schematic plan view of a nonvolatile semiconductor memory device according to a first modification of the second embodiment.

In the nonvolatile semiconductor memory device 3 according to the first modification of the second embodiment, the stacked body 11 is divided by the slit 54 every channel body layer 20. Such a structure also is included in the embodiment. For such a structure as well, the same effects as those of the nonvolatile semiconductor memory device 2 are obtained.

Second Modification of Second Embodiment

Figure 11:
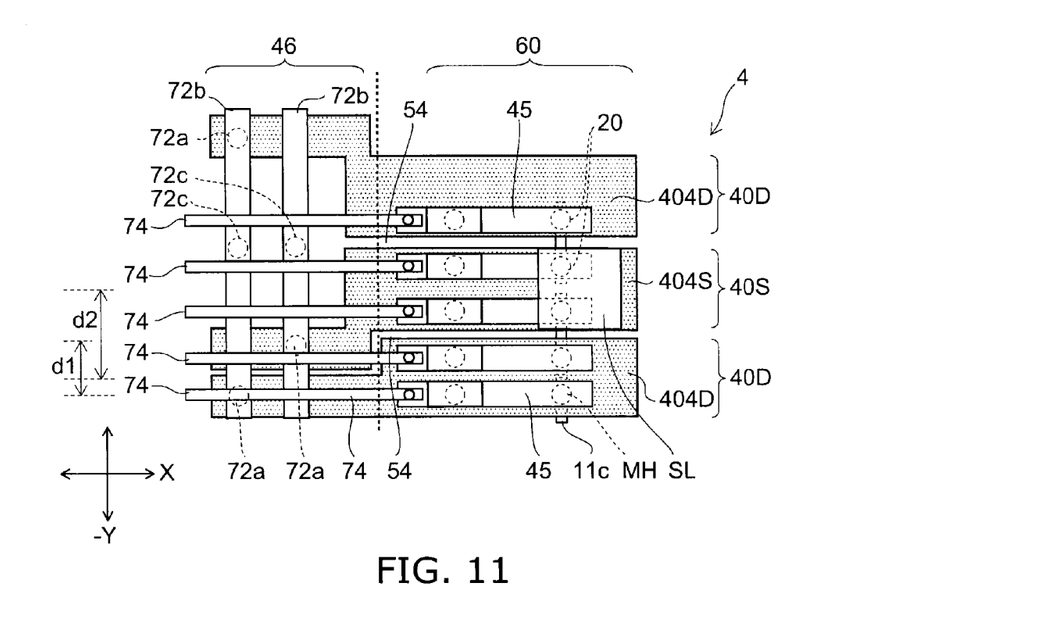
FIG. 11 is a schematic plan view of a nonvolatile semiconductor memory device according to a second modification of the second embodiment.

FIG. 11 is a schematic plan view of a nonvolatile semiconductor memory device according to a second modification of the second embodiment.

In the nonvolatile semiconductor memory device 4 according to the second modification of the second embodiment, the width of the stairstep region 46 of the first stacked body (the stacked body 11 in which the electrode layers 40S of the source side are stacked) in the Y direction is narrower than the width of the cell region 60 of the first stacked body 11 in the Y direction. Also, the width of the stairstep region 46 of the second stacked body (the stacked body 11 in which the electrode layers 40D of the drain side are stacked) in the Y direction is narrower than the width of the cell region 60 of the second stacked body in the Y direction.

Further, in the nonvolatile semiconductor memory device 4, a distance d1 between the center line of the stairstep region 46 of the first stacked body in the X direction and the center line of the stairstep region 46 of the second stacked body in the X direction is shorter than a distance d2 between the center line of the cell region 60 of the first stacked body in the X direction and the center line of the cell region 60 of the second stacked body in the X direction. In other words, in the nonvolatile semiconductor memory device 4, the width of the slit 54 in the stairstep region 46 is even greater compared to the nonvolatile semiconductor memory devices 2 and 3 as a result of the stairstep regions on the source side and the drain side that are patterned to have narrow widths being proximal to each other.

For such a structure as well, the same effects as those of the nonvolatile semiconductor memory device 2 are obtained. In the nonvolatile semiconductor memory device 4, the degrees of freedom of the drawing of the interconnects are increased further as a result of further increasing the width of the slit 54 in the stairstep region 46 compared to the nonvolatile semiconductor memory devices 2 and 3.

Third Modification of Second Embodiment

Figure 12:
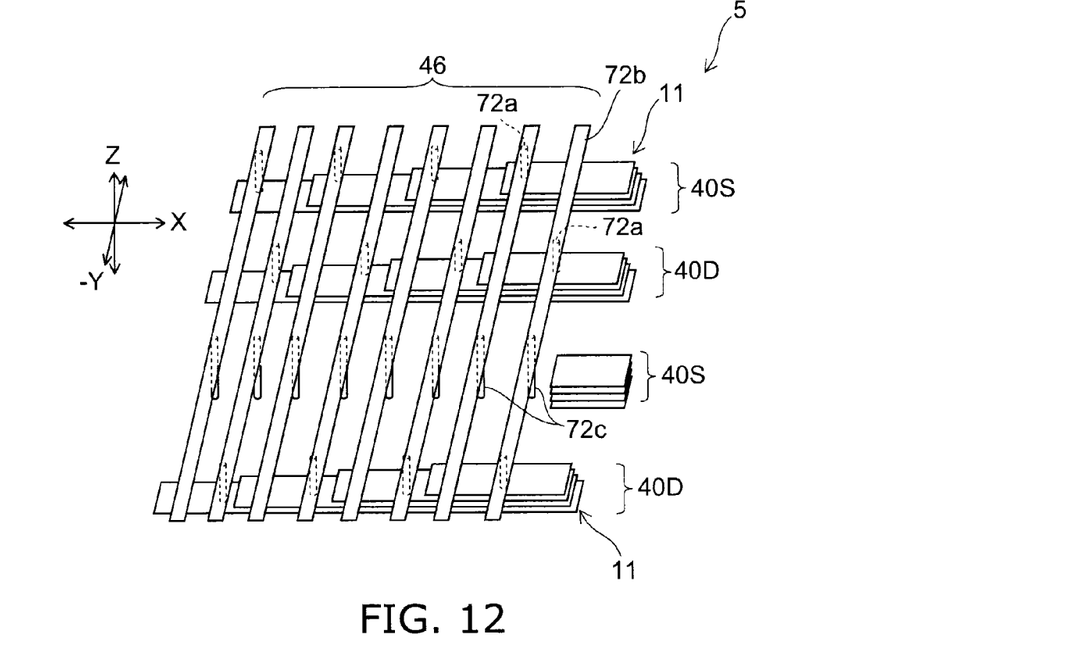
FIG. 12 is a schematic perspective view of a nonvolatile semiconductor memory device according to a third modification of the second embodiment.

FIG. 12 is a schematic perspective view of a nonvolatile semiconductor memory device according to a third modification of the second embodiment.

Figure 13:
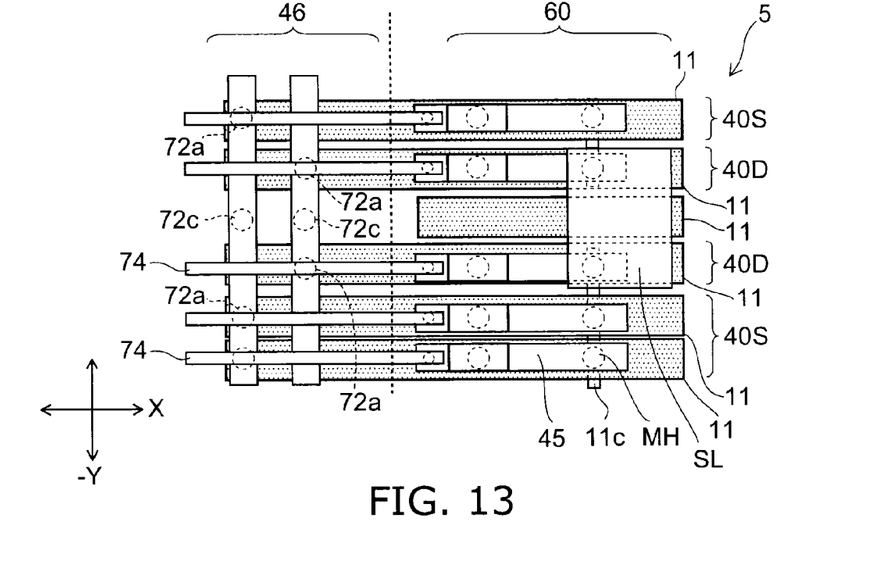
FIG. 13 is a schematic plan view of the nonvolatile semiconductor memory device according to the third modification of the second embodiment.

FIG. 13 is a schematic plan view of the nonvolatile semiconductor memory device according to the third modification of the second embodiment.

In the nonvolatile semiconductor memory device 5 according to the third modification of the second embodiment, a stacked body 41 that is unused is provided between the mutually-adjacent stacked bodies 11. In other words, the mutually-adjacent stacked bodies 11 are separated by the amount of the stacked body 41 that is provided. The stacked body 41 is in an electrically floating state. Then, in the nonvolatile semiconductor memory device 5, the word interconnect 72 electrically connected to the electrode layer 40 of the Nth layer is drawn out between the mutually-adjacent stacked bodies 11 from the upper surface 11*u* side of the stacked body 11 to the lower surface 11*d* side of the stacked body 11. For such a structure as well, the same effects as those of the nonvolatile semiconductor memory device 2 are obtained.

Fourth Modification of Second Embodiment

Figure 14:
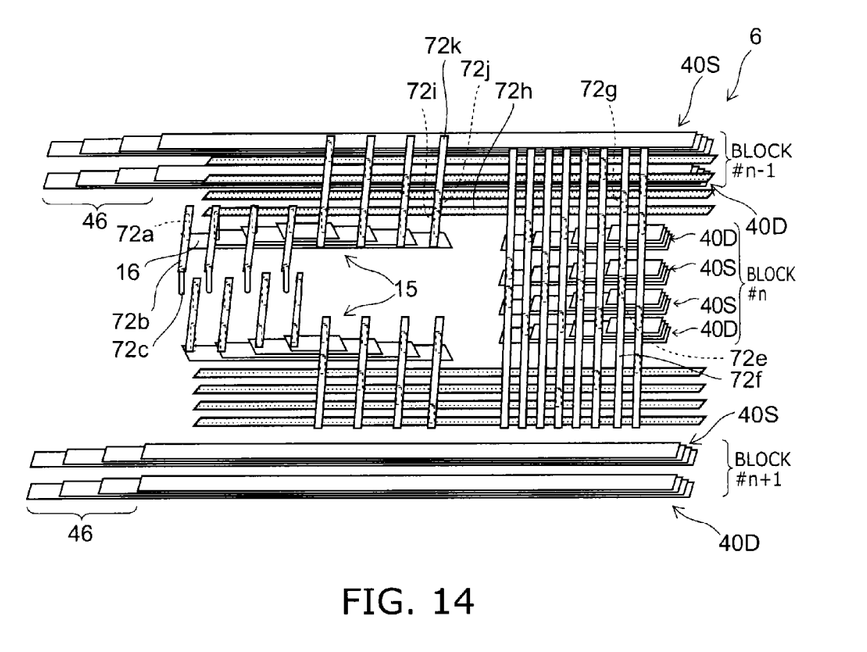
FIG. 14 is a schematic plan view of a nonvolatile semiconductor memory device according to a fourth modification of the second embodiment.

FIG. 14 is a schematic plan view of a nonvolatile semiconductor memory device according to a fourth modification of the second embodiment.

In the nonvolatile semiconductor memory devices 2 to 5 described above, the distance between the cell region 60 and the stairstep region 46 of the first stacked body (e.g., the stacked body 11 in which the electrode layers 40S of the source side are stacked) is equal to the distance between the cell region 60 and the stairstep region 46 of the second stacked body (e.g., the stacked body 11 in which the electrode layers 40D of the drain side are stacked).

In the nonvolatile semiconductor memory device 6 according to the fourth modification of the second embodiment, the distance between the cell region 60 and the stairstep region 46 of the first stacked body is shorter or longer than the distance between the cell region 60 and the stairstep region 46 of the second stacked body.

For example, in an nth block, the two electrode layers 40D of the drain side and the two electrode layers 40S of the source side interposed between the two electrode layers 40D of the drain side are provided. The electrode layers 40D and 40S belonging to the nth block are interposed between the electrode layers 40D of the drain side and the electrode layers 40S of the source side belonging to the (n−1)th block and the electrode layers 40D of the drain side and the electrode layers 40S of the source side belonging to the (n+1)th block.

In FIG. 14, the state is shown in which the distance between the cell region 60 and the stairstep region 46 for the electrode layers 40D of the drain side and the electrode layers 40S of the source side belonging to the (n−1)th (or the (n+1)th) block is longer than the distance between the cell region 60 and the stairstep region 46 for the electrode layers 40D of the drain side and the electrode layers 40S of the source side belonging to the nth block. In other words, in the nonvolatile semiconductor memory device 6, the position of the stairstep region 46 is shifted every block region.

For example, for the electrode layers 40S of the source side of the nth block, the electrode layer of each layer of the electrode layers 40S is connected to the via 72*a* by way of a via 72*e*, a draw-out interconnect 72*f*, a via 72*g*, a draw-out interconnect 72*h*, a via 72*j*, a draw-out interconnect 72*k*, a via 72*i*, and a respective electrode layer 16 of a stacked body 15. Here, the stacked body 15 provided between the (n−1)th block and the (n+1)th block is a stacked body having an island configuration in which the multiple electrode layers 16 are stacked, similarly to the stacked body 11. The material of the electrode layer 16 is polysilicon. Then, the via 72*a* is connected to the draw-out interconnect 72*b*; and further, the via 72*c* connected to the draw-out interconnect 72*b* is drawn out to the lower side of the nonvolatile semiconductor memory device 6. The via 72*i* may be drawn out to the lower side of the nonvolatile semiconductor memory device 6 without providing the stacked body 15.

For such a structure as well, the same effects as those of the nonvolatile semiconductor memory device 2 are obtained. In the nonvolatile semiconductor memory device 6, the interconnects that are drawn above the block (the (n−1)th or (n+1)th block) for which the distance between the cell region 60 and the stairstep region 46 is long are not used as interconnects other than the gate interconnects 74. Thereby, many interconnect resources can be ensured in the block (the nth block) for which the distance between the cell region 60 and the stairstep region 46 is short. Therefore, the degrees of freedom of enabling common electrical use of the word interconnects increase. Further, the drawing area of the interconnects enlarges by the amount that the common electrical use of the word interconnects is enabled.

Furthermore, by the stairstep region 46 being shifted every block, it is possible to draw the draw-out interconnects further outside the stacked body 15 in the block (the (n−1)th or (n+1)th block) for which the distance between the cell region 60 and the stairstep region 46 is long. Because the drawing area of the interconnects doubles in the area further outside the stacked body 15, the degrees of freedom of the drawing of the interconnects increase. Thereby, a nonvolatile semiconductor memory device having a higher breakdown voltage is formed.

The embodiments have been described above with reference to examples. However, the embodiments are not limited to these examples. More specifically, these examples can be appropriately modified in design by those skilled in the art. Such modifications are also encompassed within the scope of the embodiments as long as they include the features of the embodiments.

The components included in the above examples and the layout, material, condition, shape, size and the like thereof are not limited to those illustrated, but can be appropriately modified. For instance, FIGS. 6A and 6B show the manufacturing process of removing the sacrificial layers 37. However, the embodiments also include a manufacturing process of providing an insulating film of e.g. silicon oxide instead of the sacrificial layers 37, and not removing the sacrificial layers 37 at the stage of FIG. 6B. In this case, the stacked body 41 includes electrode layers 40 and an insulating layer sandwiched between the electrode layers 40.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A nonvolatile semiconductor memory device, comprising:
   a foundation layer;
   a stacked body provided on the foundation layer, the stacked body including a plurality of electrode layers stacked alternately with a plurality of insulating films;
   a plurality of first channel body layers piercing the stacked body, and the plurality of first channel body layers extending from an upper surface of the stacked body to a lower surface of the stacked body;
   a memory film provided between each of the plurality of first channel body layers and each of the plurality of electrode layers;
   a plurality of selection gates provided on the stacked body;
   a second channel body layer piercing each of the plurality of selection gates, the second channel body layer connecting to each of the plurality of first channel body layers, and the second channel body layer being provided on the one of the plurality of first channel body layers;
   a gate insulating film provided between the second channel body layer and each of the plurality of selection gates; and
   a plurality of first interconnects, one of the first interconnects electrically connected to one of the plurality of electrode layers,
   the stacked body having a through-hole communicating from the upper surface of the stacked body to the lower surface of the stacked body, the through-hole being provided outside a cell region, and the plurality of first channel body layers and the memory film are disposed in the cell region, the first interconnects commonly piercing the through-hole provided in the stacked body, and
   the first interconnects being drawn out through the through-hole from the upper surface side of the stacked body to the lower surface side of the stacked body.

2. The device according to claim 1, further comprising a second interconnect electrically connected to at least one of the plurality of selection gates,
   the second interconnect being drawn out through the through-hole from the upper surface side of the stacked body to the lower surface side of the stacked body.

3. The device according to claim 1, wherein
   at least one of the plurality of electrode layers other than the uppermost electrode layer has an exposed portion, and
   none of the plurality of electrode layers and none of the plurality of insulating layers are provided on the exposed portion.

4. The device according to claim 3, wherein the stacked body includes a plurality of the exposed portions.

5. The device according to claim 4, wherein
   each of the plurality of exposed portions has a difference in levels, and
   the stacked body has a stairstep region, and stairsteps are made of the plurality of exposed portions in the stairstep region.

6. The device according to claim 4, wherein the one of the first interconnects is electrically connected to at least one of the plurality of exposed portions.

7. The device according to claim 5, wherein the through-hole is provided outside the stairstep region as well as outside the cell region.

* * * * *